US006891706B2

(12) United States Patent
Leonov

(10) Patent No.: US 6,891,706 B2
(45) Date of Patent: May 10, 2005

(54) PROTECTED EXCITER FOR AN ELECTRICAL POWER GENERATOR AND ASSOCIATED METHODS

(75) Inventor: Vladimir Leonov, Oviedo, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 30 days.

(21) Appl. No.: 10/193,539

(22) Filed: Jul. 11, 2002

(65) Prior Publication Data

US 2004/0008459 A1 Jan. 15, 2004

(51) Int. Cl.[7] .............................. H02H 7/06; H02H 3/20
(52) U.S. Cl. ........................................ 361/20; 361/91.1
(58) Field of Search .................... 361/20, 91.1, 118, 361/127, 21; 338/21; 307/908

(56) References Cited

U.S. PATENT DOCUMENTS

| 3,721,843 A | | 3/1973 | Spisak et al. ................. 310/68 |
| 3,745,505 A | * | 7/1973 | Turnbull et al. .............. 378/13 |
| 3,852,628 A | * | 12/1974 | Spisak et al. ............. 310/68 D |
| 3,896,480 A | * | 7/1975 | Harnden ...................... 357/80 |
| 4,945,442 A | * | 7/1990 | Brockschmidt et al. ..... 361/565 |
| 5,077,485 A | * | 12/1991 | Rashid ........................ 307/84 |
| 5,093,597 A | | 3/1992 | Hughes ...................... 310/209 |
| 5,095,239 A | * | 3/1992 | Wang ......................... 310/221 |
| 5,097,195 A | * | 3/1992 | Raad et al. .................... 322/10 |
| 5,099,380 A | * | 3/1992 | Childers et al. .............. 361/56 |
| 5,155,464 A | * | 10/1992 | Cowman et al. .............. 338/21 |
| 5,183,698 A | * | 2/1993 | Stephenson et al. ........ 428/209 |
| 5,532,574 A | | 7/1996 | Wolfe et al. ................... 322/37 |
| 5,686,697 A | * | 11/1997 | Miller et al. ................. 361/791 |
| 5,699,035 A | * | 12/1997 | Ito et al. ........................ 338/21 |
| 5,731,966 A | | 3/1998 | Liu .............................. 363/53 |
| 5,750,264 A | * | 5/1998 | Ueno et al. ................. 428/426 |
| 5,831,808 A | * | 11/1998 | Girard ........................ 361/118 |

FOREIGN PATENT DOCUMENTS

FR 1 272 039 9/1961 ............ H02H/7/06

OTHER PUBLICATIONS

Studies of Non–Linear Capacitors for Application in Snubber Modules for Power Electronic Switches, J.D. Van Wyk, C.K. Campbell, M.F.K. Holm, J.J. Schoeman, Proceedings, 6th Conference on Power Electronics and Motion Control (PEMC '90) vol. 1 Budapest, Oct. 1–3, 1990, pp. 42–45.
P. Wetzel, "*Thyristorschutz mit Halbleitern—Wirtschaftlich und Sicher—Thyristor Protection by Means of Semiconductors—Efficient and Reliable*," BBC Nachrichten, Brown–Boveri Und Co. Ag. Mannheim, DE, vol. 59, No. 3/4, 1977, pp. 152–158.

* cited by examiner

*Primary Examiner*—Brian Sircus
*Assistant Examiner*—Zeev Kitov

(57) ABSTRACT

An exciter for an electrical power generator includes a shaft, an armature connected to the shaft, a field surrounding the armature to cause the armature to generate an alternating current, and a rectifying wheel The rectifying wheel includes a plurality of semiconductor switching devices connected to the rectifying wheel and arranged in a bridge configuration for rectifying the alternating current from the field. A respective non-linear protection device is connected in parallel with each of the semiconductor switching devices.

25 Claims, 8 Drawing Sheets

PROTECTED EXCITER FOR AN ELECTRICAL POWER GENERATOR AND ASSOCIATED METHODS

FIELD OF THE INVENTION

The present invention relates to the field of power generation and, more particularly, to an exciter for an electrical generator and associated methods.

BACKGROUND OF THE INVENTION

A power generator typically includes a stator, a rotor that turns within the stator to generate electrical power, and a mechanically driven shaft to turn the rotor within the stator. The rotor includes a field winding, to which an exciter current is supplied in generating electrical power. The exciter current typically is supplied with an exciter.

The exciter itself can be an alternating current generator driven by the same source (e.g., steam-powered turbine) as the rotor and feeding the direct current to the field winding of the rotor via brushes and slip-rings. Increasingly, however, "brushless" exciters are being used in electrical generators. With a brushless exciter, the DC current is derived from an alternating current. The alternating current is generated in the winding or armature placed on a shaft connected to the rotor, and a rectifier circuit converts the resulting alternating current into the direct current that is supplied to the field winding of the rotor.

An exciter includes a shaft, an armature connected to the shaft, a field surrounding the armature to generate an alternating current, and a rectifying wheel connected to the shaft. The rectifying wheel, moreover, typically comprises a plurality of semiconductor switching devices arranged so as to rectify the alternating current generated by the armature rotating within the field. The semiconductor switching devices can be, for example, a diode that conducts current when forward-biased.

A common problem associated with conventional rectifying circuits is commutation voltage spikes. These voltage spikes stem from turn-off transients associated with the use of semiconductor switching devices, such as diodes. As a rectifying diode transitions from a conducting state to a non-conducting state, a reverse recovery current is produced. The reverse recovery current can damage the semiconductor switching device. Moreover, were such damage to cause a diode failure, a phase-to-phase fault could result in destructively high currents within the armature windings. This danger is particularly acute in large-scale electrical generators in which high power density brushless exciters are typically used.

One conventional approach to reducing the level of voltage spikes during the transition of the rectifying diodes is to couple a snubber circuit to the rectifying diodes. Such a circuit typically includes a capacitor, resistor and fuse, with the capacitor being used to absorb stored charge during reverse recovery. Such circuits can be costly to produce and take up space within an electrical generator while adding weight to the exciter.

Another approach is found in U.S. Pat. No. 5,093,597 to Hughes, which discloses a saturable reactor diode snubber assembly that includes a thin film membrane composed of a saturable magnetic material. When a rectifying diode is conducting current, the saturable reactor diode snubber is in saturation, thereby exhibiting low impedance to the current. In transitioning to a non-conducting condition, however, the magnetic film of the saturable reactor loses its saturation and exhibits linear properties as the current approaches zero. Thus, when the diode transitions to a non-conducting state and the reverse current recovery condition arises, the saturable reactor diode snubber provides a high impedance to thereby reduce reverse recovery peak current and diode-stored energy.

One problem with such a device is that the saturable reactor will become extremely hot unless cooled, as, for example, by forced air. When natural convection cooling is applied, the temperature rise associated with the saturable reactor diode snubber is too high for operation (e.g., up to 120° C.). U.S. Pat. No. 5,731,966 to Liu attempts to deal with the problem by adding a resetting circuit that provides an additional conductive path coupled to a saturable reactor. The additional circuit, however, increases the complexity of the snubber circuit and thus increases the risk of a potential failure of the system.

Still another approach is that of U.S. Pat. No. 5,532,574 to Wolfe et al., which relies on a protection circuit that monitors the output voltage of a diode bridge rectifier and interrupt its operation if the voltage is not within an acceptable range. Such additional circuitry, however, suffers from many of the same problems associated with other conventional devices. For example, the additional circuitry adds weight to the exciter and uses additional space within the limited confines of the electrical generator, all while increasing the number of costly components of the exciter, increasing its complexity and, accordingly, its potential for malfunction.

SUMMARY OF THE INVENTION

With the foregoing background in mind, it is therefore an object of the present invention to provide an exciter that is more efficiently protected from a risk of damage due to commutation voltage spikes.

This and other objects, features, and advantages in accordance with the present invention are provided by an exciter that may include a shaft, an armature connected to the shaft, a field surrounding the armature so as to cause the armature to generate an alternating current, and a rectifying wheel connected to the shaft to rectify the alternative current. The rectifying wheel, more particularly, may include a plurality of semiconductor switching devices arranged in a bridge configuration, and a respective non-linear protection device connected in parallel with each semiconductor switching device.

Each non-linear protection device may be positioned adjacent a respective semiconductor switching device. Each non-linear protection device, moreover, may comprise a non-linear material layer. The non-linear material layer, more particularly, may comprise an elastomeric material. Such elastomeric material layer, for example, may comprise a silicone elastomer with silicon carbide therein. The non-linear material layer may have an annular shape surrounding a respective semiconductor switching device in some embodiments. Alternately, the non-linear material layer may comprise an epoxy material having non-linear properties, the epoxy material contacting the switching device and providing an encapsulation around it.

The rectifying wheel further may comprise a plurality of pairs of heat sinks, with each of the plurality of semiconductor switching devices mounted between a respective pair of heat sinks. Each nonlinear protection device may further comprise a pair of electrodes carried in spaced apart relation by the pair of heat sinks. Each non-linear protection device may also comprise an insulated stud on which is mounted the respective pair of electrodes and non-linear material layer.

In other embodiments, each semiconductor switching device of the exciter may comprise a pair of spaced apart electrodes and an integrated circuit between the pair of spaced apart electrodes. Accordingly, each non-linear protection device may comprise a non-linear material layer extending between the electrodes.

Each semiconductor switching device further may comprise a housing surrounding the integrated circuit. Moreover, the non-linear material layer of a respective non-linear protection device may be within the housing. Additionally, each non-linear protection device may further comprise a spring member connected in series with the non-linear material layer. Each semiconductor switching device may comprise one of a diode and a thyristor, for example.

A further aspect of the invention pertains to a method of protecting semiconductor switching devices of a rectifying wheel of an exciter. The method may comprise connecting a respective non-linear protection device in parallel with each semiconductor switching device. The non-linear protection device, moreover, may comprise a non-linear material layer.

DETAILED DESCRIPTION OF THE PREFERRED EMBODIMENTS

The present invention will now be described more fully hereinafter with reference to the accompanying drawings that illustrate preferred embodiments of the invention. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
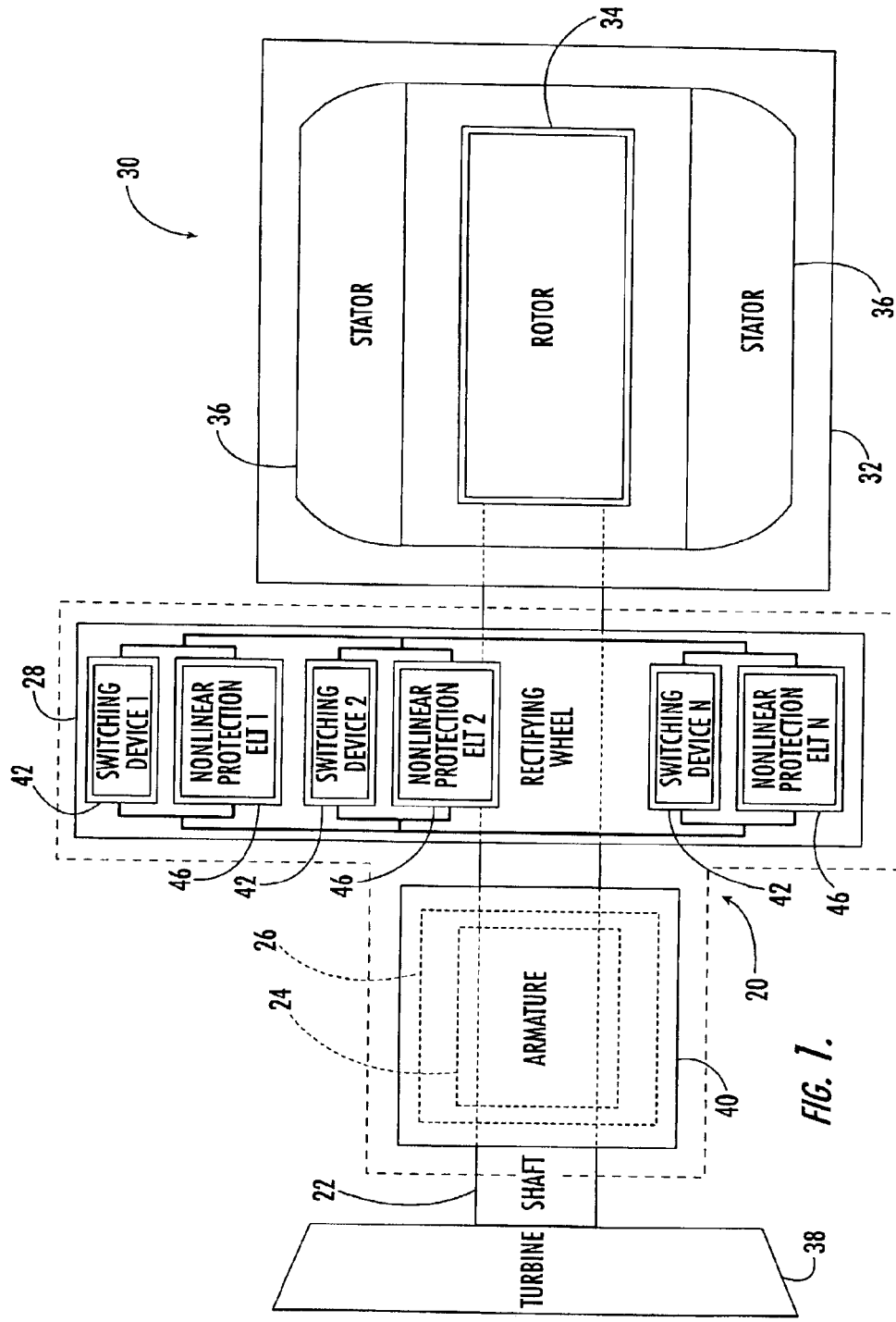
FIG. 1 is a schematic diagram of an electrical power generator including an exciter according to the invention.
Figure 2:
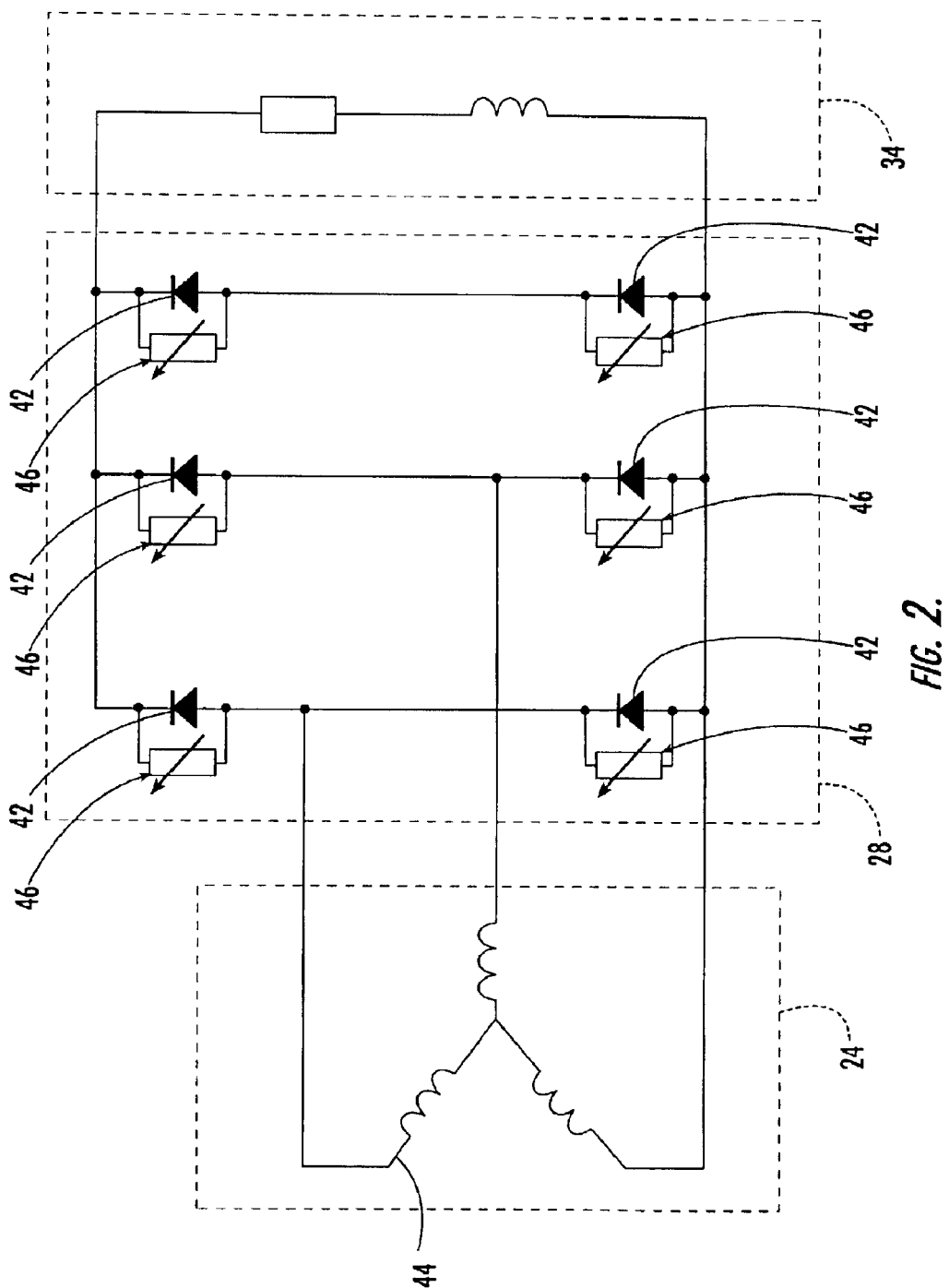
FIG. 2 is schematic circuit diagram of a bridge arrangement of a plurality of switching devices of the exciter illustrated in FIG. 1.

Referring initially to FIGS. 1 and 2, an exciter 20 according to the present invention is described in the context of an electrical generator 30 in which the exciter can be used. The exciter 20 illustratively includes a shaft 22, an armature 24 connected to the shaft, a field 26 surrounding the armature, and a rectifying wheel 28 connected to the shaft. The electrical generator 30 comprises a generator housing 32, a rotor 34 within the housing and connected to the shaft 22, and a stator 36 within which the rotor is rotated by the shaft for generating electrical power as will be readily understood by those skilled in the art.

In being connected to the shaft 22 along with the rotor 34, the armature 24 and rotor can both be powered by the same source. Illustratively, the source is a turbine 38, which, for example, can be a steam-driven turbine as will be readily understood by those skilled in the art. Alternately, the source can be a hydro-powered turbine, as will also be readily appreciated by those skilled in the art. Other power sources, of course, will also come to the mind of one skilled in the art.

As the turbine 38 rotates the shaft 22, the armature 24 of the exciter 20 turns to generate an alternating current. As will be readily understood by those skilled in the art, the alternating current can be generated, for example, by rotating the armature 24 within a magnetic field surrounding the armature and generated by the field 26 to thereby cause the armature to generate an alternating current. The exciter 20 illustratively includes a housing 40 that encloses the armature 24.

The resulting alternating current produced by the rotation of the armature 24 is converted to direct current and supplied to the rotor 34. To convert the alternating current to direct current, the rectifying wheel 28 of the exciter 20 includes a plurality of semiconductor switching devices 42. As perhaps best shown by the schematic representation of FIG. 2, the plurality of switching devices are arranged in a bridge configuration, with the plurality of semiconductor switching devices 42, illustratively comprising diodes that electrically connect via a three-phase "wye" connection 44 to the armature 24 of the exciter 20. As will be readily appreciated by those skilled in the art, the electrical connection alternately may comprise a delta connection, and, indeed, the bridge configuration may be adapted for use with other types of power generating devices.

The plurality of switching devices 42 may be arranged in a radial alignment as separate spokes along an inner surface portion of the rectifying wheel 26. As will be appreciated by those skilled in the art, however, other arrangements are possible. For example, the switching devices 42 alternately can be arranged axially along an elongate wheel that extends parallel with and is driven by the shaft 22. A switching device 42 may comprise a silicon die connected to electrodes. It may alternately comprise a diode, thyristor, or other switching device familiar to those skilled in the art.

Figure 3:
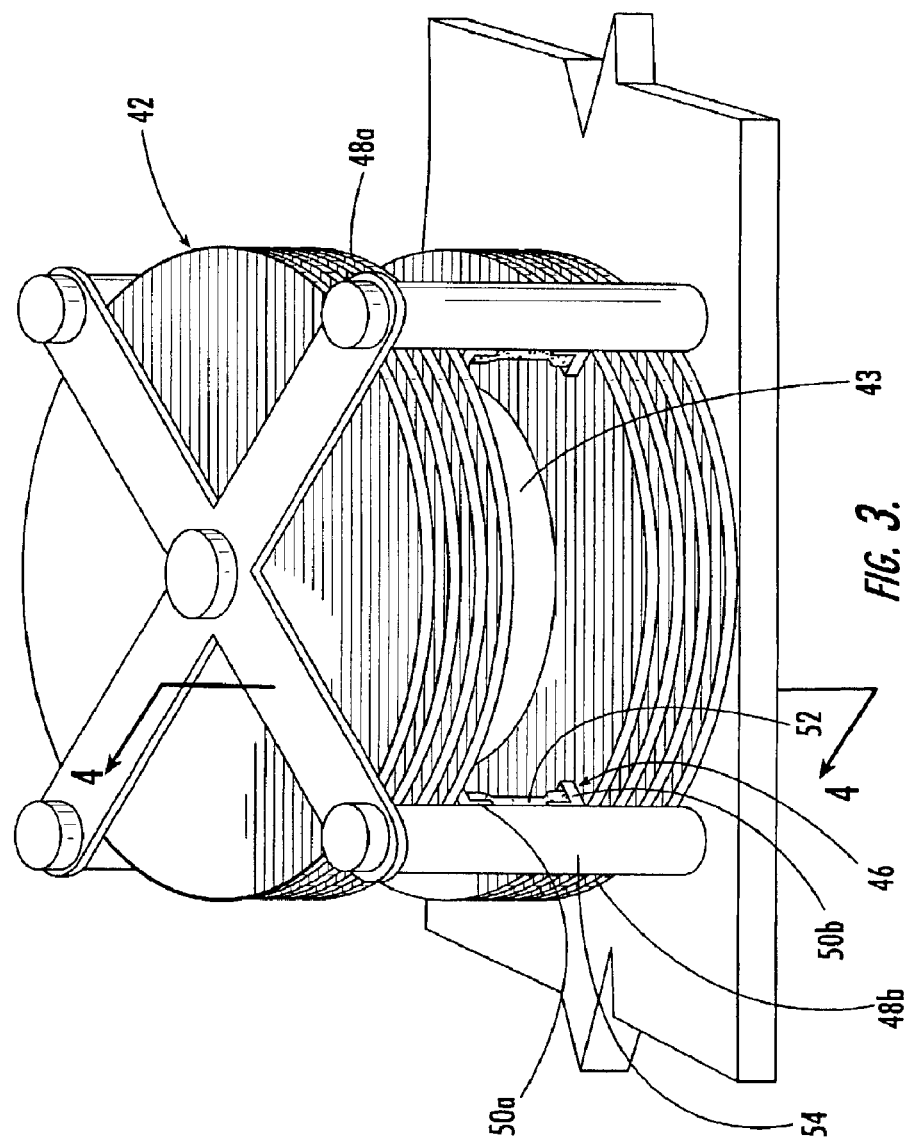
FIG. 3 is a perspective view of a switching device and non-linear protection device of the rectifying wheel of the exciter shown in FIG. 1.
Figure 4:
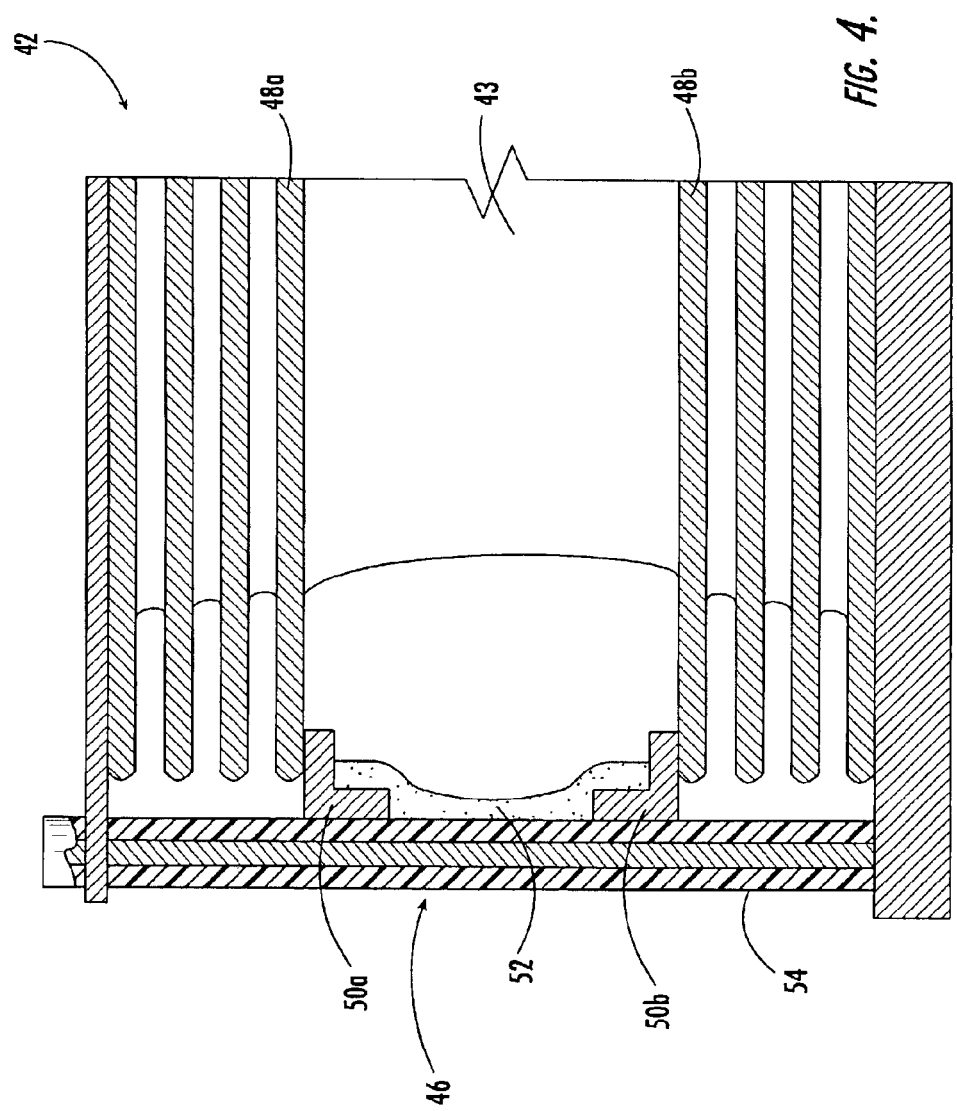
FIG. 4 is a cross-sectional view of a portion of a semiconductor switching device and non-linear protection device taken along line 4—4 of FIG. 3.

Referring additionally now to FIGS. 3 and 4, the exciter 20 further comprises at least one respective non-linear protection device 46 for each switching devices 42, each at least one non-linear protection for protecting a corresponding switching device from commutation voltage spikes that may occur as the switching devices transition from a conducting state to a non-conducting state. Such transition can result in reverse recovery current flows that might otherwise damage the semiconductor switching devices 42. Such damage, moreover, could cause a failure of the semiconductor switching device and a corresponding phase-to-phase fault resulting in destructively high currents within the armature 24.

Thus, to reduce these risks, the non-linear protection device 46 is connected in parallel with a respective semiconductor switching device 42. As the voltage across a semiconductor switching device 42 increases during a transition, the electrical resistance of the non-linear protection device 46 decreases and, accordingly, a greater part of the energy can be dissipated through the non-linear protection device connected in parallel with the semiconductor switching device 42.

In some embodiments, each semiconductor switching device 42 of the exciter 20 comprises a "pancake" or "hockey puck" diode 43, as understood by those skilled in the art, and an adjacent pair of spaced-apart conductors 48a, 48b between which the diode is mounted. More particularly, the spaced-apart conductors 48a, 48b may be "heat sinks" as shown in the illustrated embodiment.

As shown in FIG. 4, each non-linear protection device 46 illustratively comprises first and second electrodes 50a, 50b that are carried in spaced-apart relation by first and second opposing faces of the adjacent pair of spaced-apart conductive heat sinks 48a, 48b. A non-linear material layer 52 extends between the first and second electrodes 50a, 50b. Additionally, an insulated stud 54 extends between the first and second spaced-apart conductive heat sinks 48a, 48b. The non-linear material layer 52 is carried by the insulated stud 54. As will be readily appreciated by one skilled in the art, first and second electrodes of the non-linear protection device alternately may each be carried by one heat sink of an adjacent pair, the non-linear material layer extending between the first and second electrodes.

Figure 5:
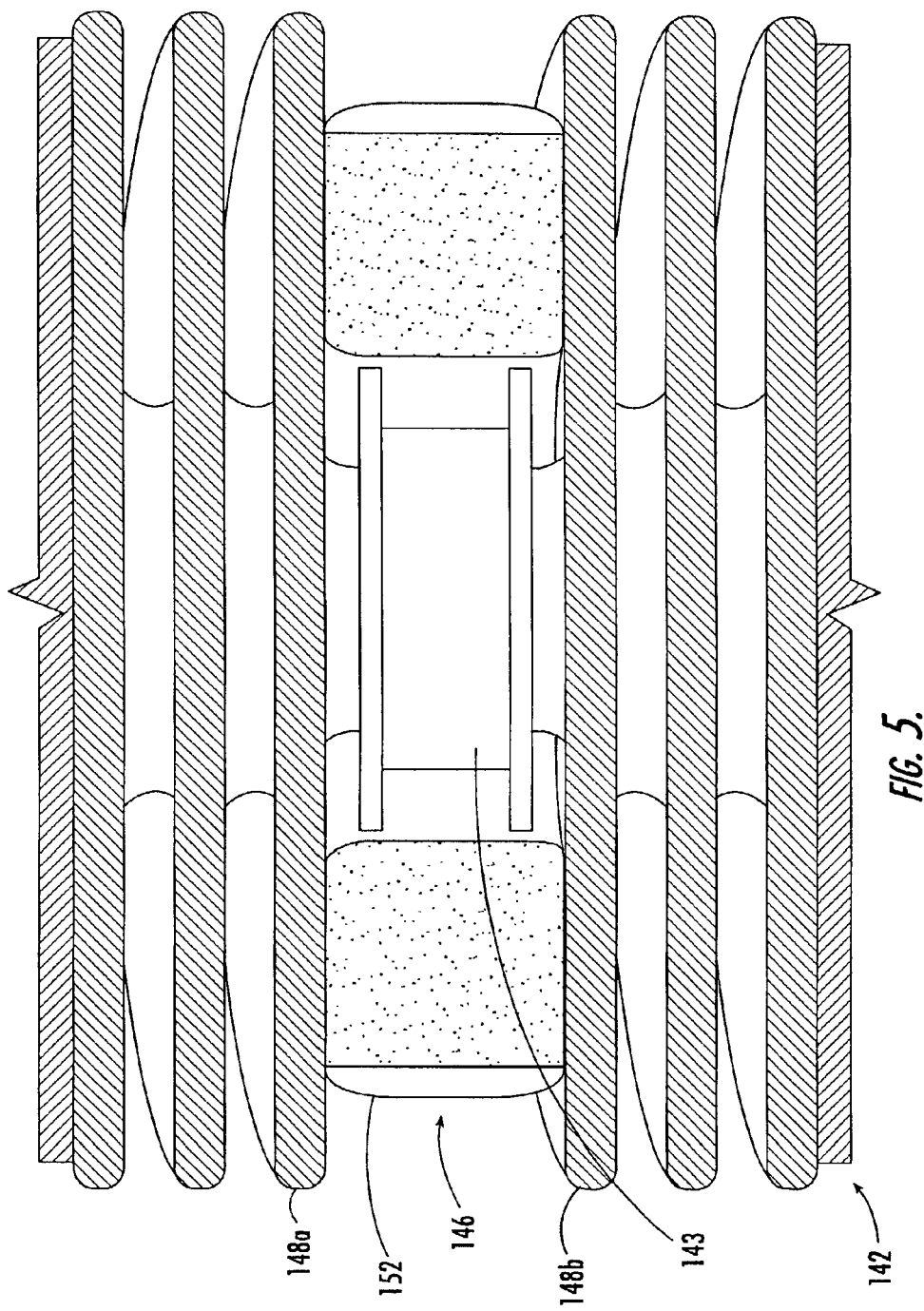
FIG. 5 is a cross-sectional view of a portion of another embodiment of a semiconductor switching device and a non-linear protection device according to the present invention.

An additional embodiment of the invention is illustrated in FIG. 5. As shown, the non-linear protection device 146 is again adjacent a semiconductor switching device 142, which illustratively comprises a pancake or hockey puck diode 143 between adjacent conductive heat sinks 148a, 148b. Rather than being carried by an insulated stud, however, the non-linear protection device 146 comprises a non-linear material layer 152 that extends between and is supported by the adjacent conductive heat sinks 148a, 148b.

The non-linear material layer 152 may comprise an elastomeric material that conforms to the region between the adjacent conductive heat sinks 148a, 148b to thereby fit securely therein and form a good electrical connection thereto. The material of the non-linear material layer 152, for example, may comprise a silicone elastomer with silicon carbide as will be readily understood by those skilled in the art.

More particularly, the non-linear material layer 152 has an annular shape and surrounds the semiconductor switching device 142. In surrounding the respective semiconductor switching device 142, the nonlinear material layer 152 not only provides a good electrical connection, but also encapsulates the semiconductor switching device so as to prevent contamination of the device.

Although the non-linear material layer 152 is shown as extending around the diode 143 while remaining space apart therefrom, it will be readily appreciated by those skilled in the art that the non-linear material layer 152 alternately may fill-in the region adjacent the diode 143 and conductive heat sinks 148a, 148b. The non-linear material layer 152, thus, may contact the diode 143 rather than being spaced-apart therefrom. Such a non-linear material layer, for example, may comprise an epoxy material with non-linear properties, the epoxy material contacting the diode 143 and also contacting the conductive heat sinks 148a, 148b to form an electrical connection therewith.

In conventional exciters, contaminants such as dirt, fly ash, and other foreign objects can build up on the heat sinks and eventually provide an electrical path from the diode to the rectifier wheel forging, bypassing insulation between the heat sink and rectifier wheel. Such contamination is thought to be a major source of exciter failures and is especially problematic if the diode has lost its hermetic integrity. Thus, the encapsulation of the respective semiconductor switching device 142 with the annular non-linear material layer 152 according to the present invention can prevent such contamination and resultant exciter failures, as well as reduce the likelihood of damage due to commutation voltage spikes. The encapsulation of the semiconductor switching device 142 with the annular non-linear material layer 152 also prevents debris from spreading throughout the exciter 120 if the semiconductor switching device 142 should rupture during operation of the electrical generator.

Figure 6:
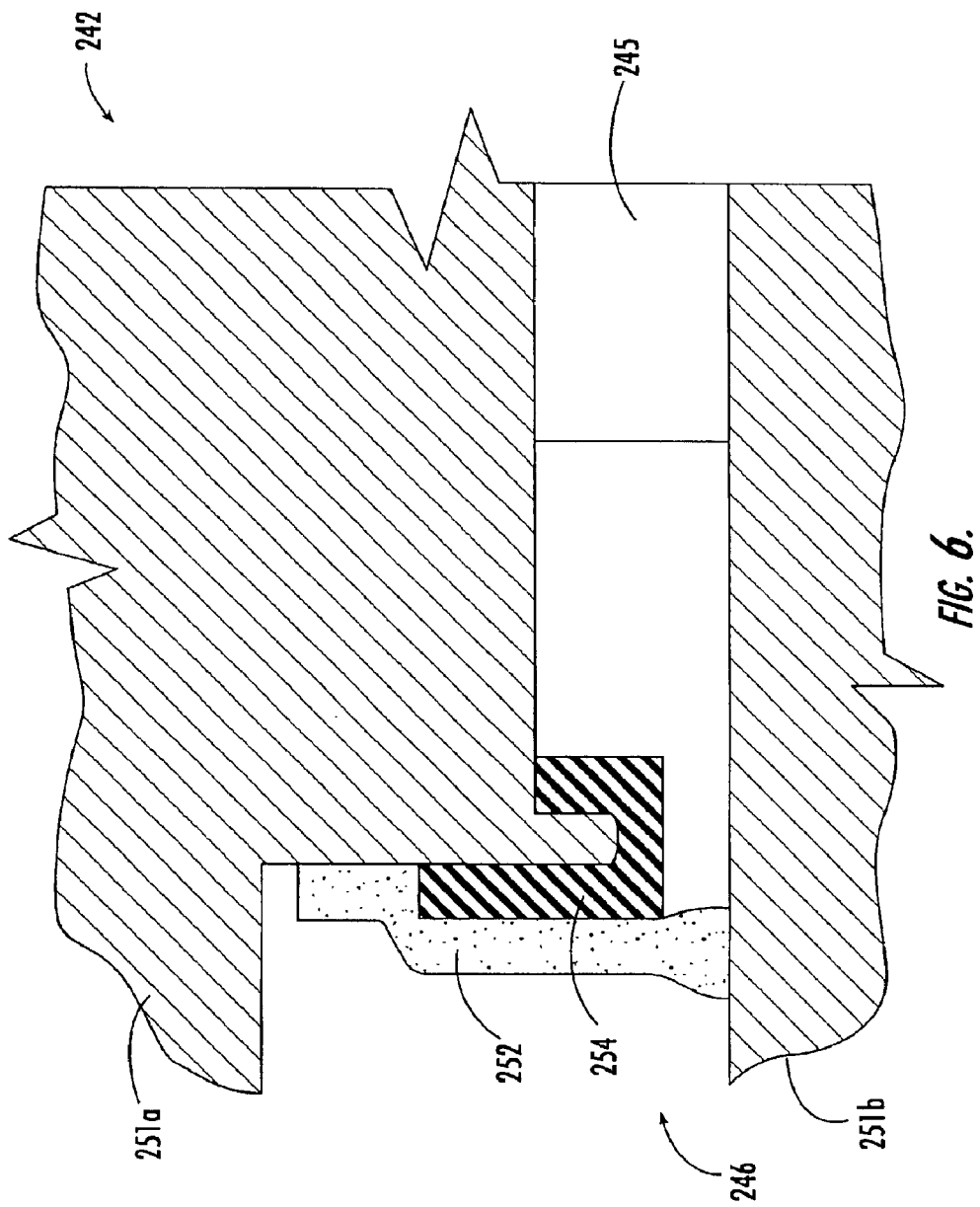
FIG. 6 is a cross-sectional view of a portion of still another embodiment of a semiconductor switching device and a non-linear protection device according to the present invention.

Referring now to FIG. 6, yet another embodiment is illustrated. According to this embodiment, each of a plurality of semiconductor switching devices 242 of an exciter comprises spaced-apart electrodes 251a, 251b, and an integrated circuit 245 extending between the electrodes. Additionally, a respective non-linear protection device 246 is connected in parallel with each semiconductor switching device 242 and comprises a non-linear material layer 252 extending between the spaced-apart electrodes 251a, 251b. As illustrated, an insulation layer 254 is interposed between a portion of one electrode 251a and a portion of the non-linear material layer 252.

More particularly, the non-linear material layer 252 may have elastic properties as described above so as to deflect while also providing a strong and secure electrical contact with both the electrodes 251a, 251b. The insulation layer 254 allows heat transfer therethrough to the electrode 251a and onto a heat sink (not shown) that connects to the electrode.

Figure 7:
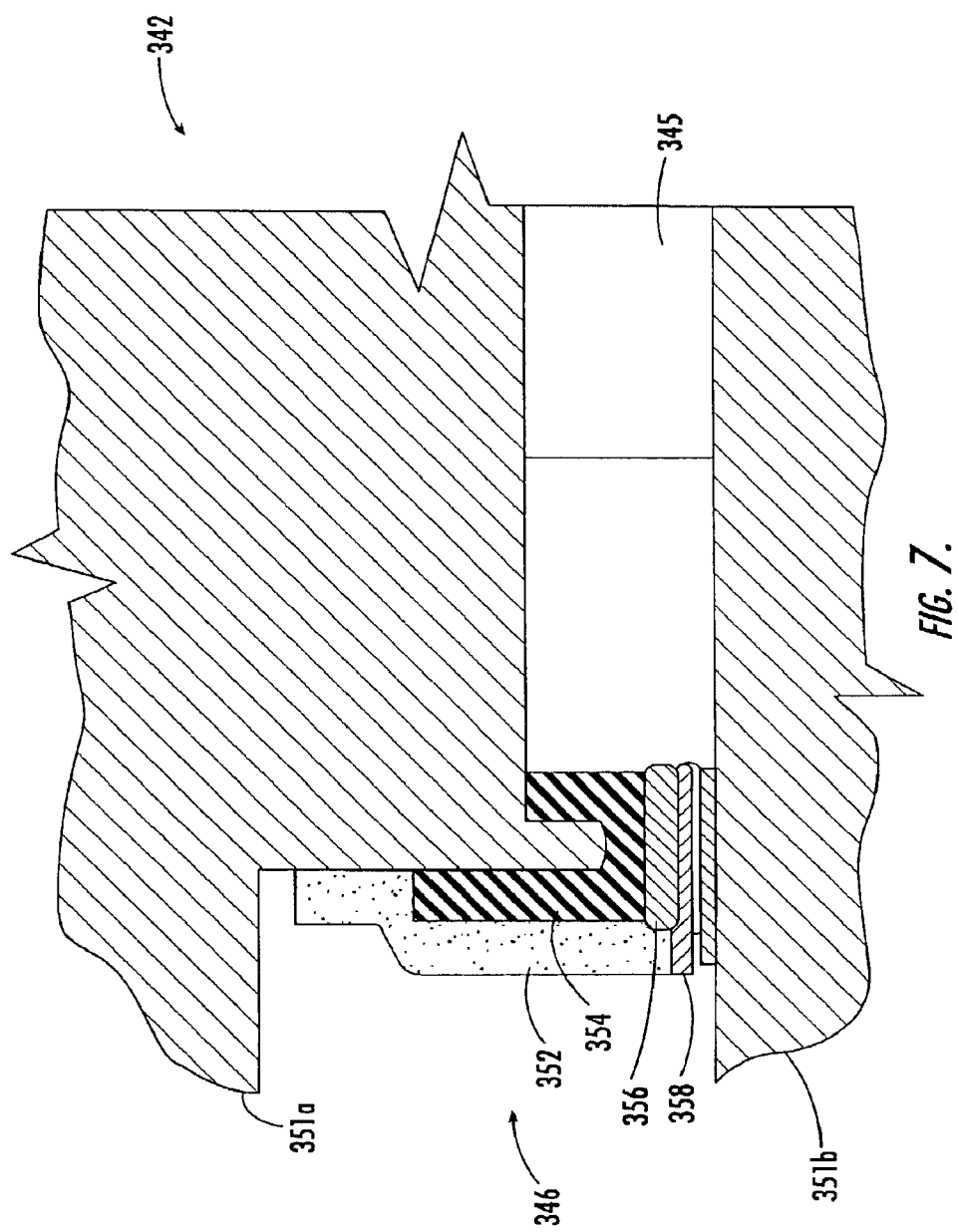
FIG. 7 is a cross-sectional view of a portion of yet a further embodiment of a semiconductor switching device and a non-linear protection device according to the present invention.

In yet a further embodiment illustrated in FIG. 7, each semiconductor switching device 342 of an exciter comprises spaced-apart electrodes 351a, 351b, and an integrated circuit 345 extending between the electrodes. A respective non-linear protection device 346 comprises a non-linear material layer 352, an insulation layer 354 contacting the non-linear material layer, and a conductive ring 356 that extends around a portion of the semiconductor switching device 342 while contacting both the non-linear material layer and the insulation layer.

The non-linear protection device 346 further comprises a conductive spring 358 that contacts the conductive ring 356 and one electrode 351b of the semiconductor switching device 342. The conductive spring 358 provides an electrical connection between the electrodes 351a, 351b through the non-linear material layer 252 while accommodating relative movement of the respective electrodes, which is of particular benefit during installation and clamping of the device as will be readily appreciated by those skilled in the art.

Figure 8:
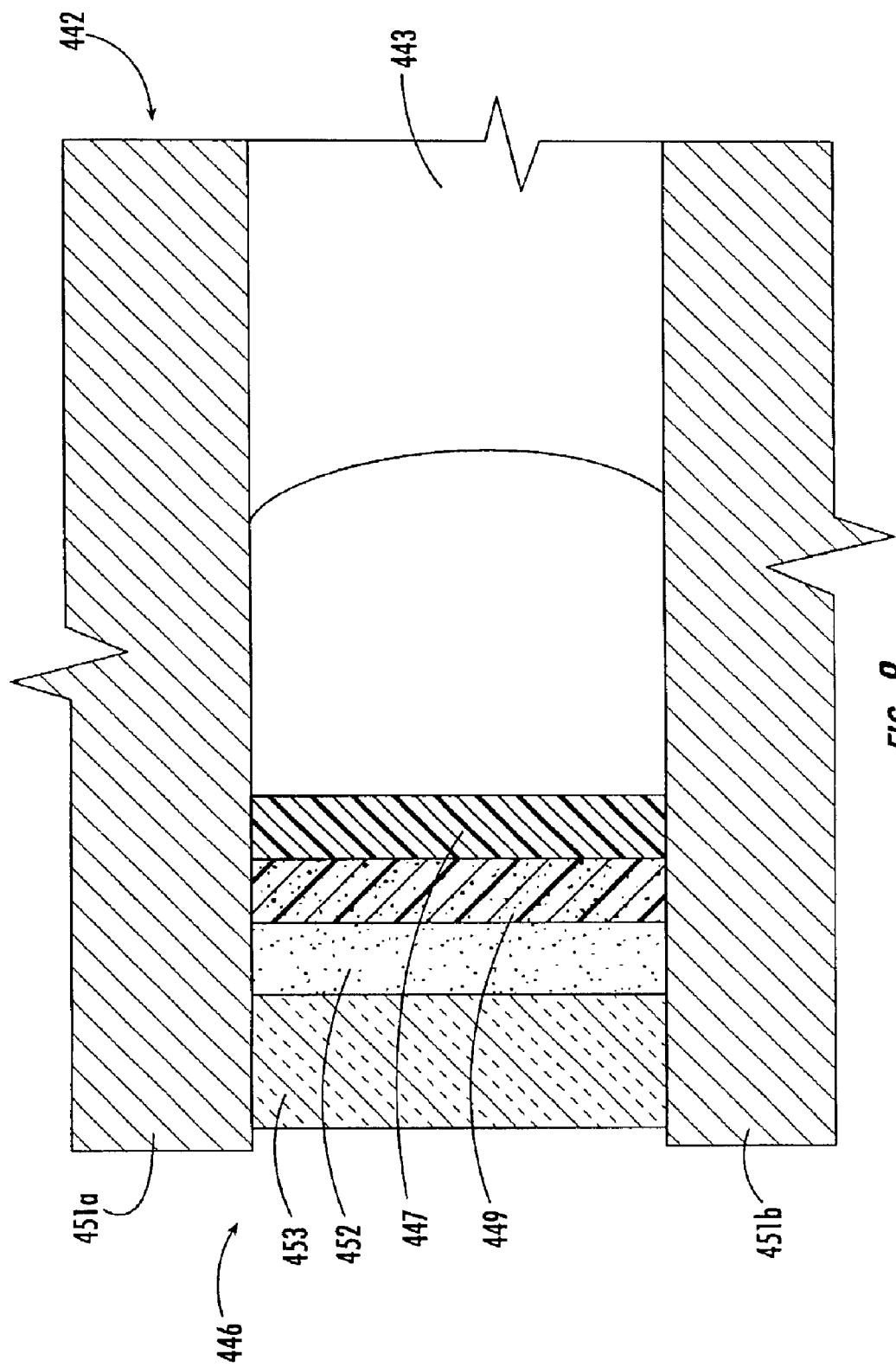
FIG. 8 is a cross-sectional view of a portion of still a further embodiment of a semiconductor switching device and a non-linear protection device according to the present invention.

Referring now to FIG. 8, in yet another embodiment each semiconductor switching device 442 comprises a pair of spaced-apart electrodes 451a, 451b and an integrated circuit 443 between the electrodes. The semiconductor switching device 442, moreover, comprises a housing 453 surrounding the integrated circuit 442. The housing, for example, may be annular and may be made of ceramic. Within the housing 453 is a non-linear material layer 452 that extends between the electrodes 451a, 451b of the semiconductor switching device 442. In addition, an insulating layer 447, such as a plastic ring, lies within the housing 453 and the non-linear material layer 452 and also encases the integrated circuit 443.

Another layer 449 is illustratively interposed between the non-linear material layer 452 and the insulating ring 447. As will be readily appreciated by those skilled in the art this additional layer 449 can comprise an epoxy resin or paint that is used as necessary to reduce peeling away of the nonlinear material layer 352.

FIGS. 1–8 further illustrate aspects of the invention pertaining to a method of protecting a semiconductor switching device 42. The method comprises connecting a non-linear protection device 46 in parallel with the semiconductor switching device 42. Connecting, moreover, comprises connecting a non-linear protection device 46 that has a non-linear material layer 52. Illustratively, the non-linear material layer 52 comprises an elastomeric material. A method aspect of the invention also comprises forming a nonlinear material layer 152 to have an annular shape at least partially surrounding a respective semiconductor switching device 142. In addition, a method aspect of the invention also comprises forming a housing 453 at least partially surrounding the respective semiconductor switching device 442 and a non-linear material layer 452.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An exciter comprising:
a shaft;
an armature connected to said shaft;
a field surrounding said armature to cause said armature to generate an alternating current; and
a rectifying wheel connected to said shaft and comprising
a plurality of pairs of heat sinks;
a plurality of semiconductor switching devices arranged in a bridge configuration for rectifying the alternating current from said armature and with each semiconductor switching device being mounted between a respective pair of heat sinks, and
a respective non-linear protection device connected in parallel with each semiconductor switching device and comprising a non-linear material layer positioned between the heat sinks and electrically conductive through the heat sinks to the semiconductor switching device to provide protection for commutation voltage spikes.

2. An exciter according to claim 1 wherein each non-linear protection device is positioned adjacent a respective semiconductor switching device and comprises a non-linear material layer.

3. An exciter according to claim 2 wherein said non-linear material layer comprises an elastomeric material.

4. An exciter according to claim 3 wherein said elastomeric material layer comprises a silicone elastomer with silicon carbide therein.

5. An exciter according to claim 1 wherein each non-linear protection device further comprises a pair of electrodes carried in spaced apart relation by the pair of heat sinks.

6. An exciter according to claim 5 wherein each non-linear protection device further comprises an insulated stud mounting the respective pair of electrodes and non-linear material layer.

7. An exciter according to claim 2 wherein said non-linear material layer has an annular shape surrounding the respective semiconductor switching device.

8. An exciter according to claim 1 wherein each semiconductor switching device comprises a pair of spaced apart electrodes and an integrated circuit therebetween; and wherein the respective non-linear protection device comprises a non-linear material layer extending between said electrodes.

9. An exciter according to claim 8 wherein each semiconductor switching device further comprises a housing surrounding said integrated circuit; and wherein said non-linear material layer is within said housing.

10. An exciter according to claim 8 wherein each non-linear protection device further comprises a spring member connected in series with said non-linear material layer.

11. An exciter according to claim 1 wherein each semiconductor switching device comprises a diode.

12. A rectifying wheel for an exciter and comprising:
a plurality of pairs of heat sinks;
a plurality of semiconductor switching devices arranged in a bridge configuration for rectifying alternating current, and with each semiconductor switching device being mounted between a respective pair of substantially parallel conductive plates forming heat sinks and conductive therewith; and
a respective non-linear protection device connected in parallel with each semiconductor switching device and comprising a non-linear material layer positioned between said heat sinks and electrically conductive through said heat sinks to said semiconductor switching device to provide protection for commutation voltage spikes.

13. A rectifying wheel according to claim 12 wherein said non-linear material layer comprises an elastomeric material.

14. A rectifying wheel according to claim 12 wherein each non-linear protection device further comprises a pair of electrodes carried in spaced apart relation by the respective pair of heat sinks.

15. A rectifying wheel according to claim 12 wherein said non-linear material layer has an annular shape surrounding the respective semiconductor switching device.

16. A rectifying wheel for an exciter and comprising:
a plurality of pairs of heat sinks;
a plurality of semiconductor switching devices connected in a bridge configuration for rectifying the alternating current, each semiconductor switching device being mounted between a respective pair of heat sinks and comprising a pair of spaced apart, substantially parallel conductive plates forming electrodes and an integrated circuit positioned between and connected to the electrode; and
a respective non-linear protection device connected in parallel with each semiconductor switching device, each non-linear protection device comprising a non-linear material layer positioned between the heat sinks and electrically conductive through the heat sinks to the semiconductor switching device to provide protection for commutation voltage spikes.

17. A rectifying wheel according to claim 16 wherein said non-linear material layer comprises an elastomeric material.

18. A rectifying wheel according to claim 16 wherein said non-linear material layer has an annular shape surrounding the respective integrated circuit.

19. A rectifying wheel according to claim 16 wherein each semiconductor switching device further comprises a housing surrounding said integrated circuit; and wherein said non-linear material layer is within said housing.

20. A rectifying wheel according to claim 16 wherein each non-linear protection device further comprises a spring member connected in series with said non-linear material layer.

21. A rectifying wheel according to claim 16 wherein each semiconductor switching device comprises a diode.

22. A method of protecting semiconductor switching devices of a rectifying wheel for an exciter, the method comprising:

forming a plurality of pairs of heat sinks;

arranging a plurality of semiconductor switching devices in a bridge circuit configuration;

mounting each semiconductor switching device between a respective pairs of heat sinks; and connecting in parallel with each semiconductor switching device a respective non-linear protection device that is formed from a non-linear material layer positioned between the heat sinks and electrically conductive through the heat sinks to the semiconductor switching device to provide protection for commutation voltage spikes.

23. A method according to claim 22 wherein connecting comprises connecting a respective non-linear protection device comprising a non-linear material layer.

24. A method according to claim 23 wherein the non-linear material layer comprises an elastomeric material.

25. A method according to claim 23 wherein connecting comprises connecting a respective non-linear protection device comprising a non-linear material layer so that the non-linear material layer has an annular shape surrounding a respective semiconductor switching device.

* * * * *